United States Patent [19]

Arai et al.

[11] 4,096,510
[45] Jun. 20, 1978

[54] THERMAL PRINTING HEAD

[75] Inventors: Shoji Arai; Shige Kuninobu, both of Kyoto; Sumio Maekawa, Hirakata, all of Japan

[73] Assignee: Matsushita Electric Industrial Co., Ltd., Kadomi, Japan

[21] Appl. No.: 821,928

[22] Filed: Aug. 3, 1977

Related U.S. Application Data

[63] Continuation of Ser. No. 605,922, Aug. 19, 1975, abandoned.

[30] Foreign Application Priority Data

Aug. 19, 1974 Japan .................................. 49-95300
May 19, 1975 Japan .................................. 50-59826

[51] Int. Cl.² .................... H01L 23/56; H01L 29/66; H01L 23/48
[52] U.S. Cl. .......................... 357/28; 357/65; 357/67; 357/59; 357/71; 219/216; 219/543
[58] Field of Search .................. 357/65, 67, 71, 28, 357/59; 219/216, 543

[56] References Cited

U.S. PATENT DOCUMENTS

| | | | |
|---|---|---|---|
| 3,609,294 | 9/1971 | Cady | 357/28 |
| 3,632,436 | 1/1972 | Denning | 357/71 |
| 3,633,076 | 1/1972 | Arndt | 357/71 |
| 3,667,008 | 5/1972 | Katnack | 357/59 |
| 3,746,944 | 1/1973 | Naradka et al. | 357/71 |
| 3,796,928 | 3/1974 | Doo et al. | 357/59 |
| 3,852,563 | 12/1974 | Bohorquez | 357/28 |
| 3,913,126 | 10/1975 | Hooker et al. | 357/59 |
| 3,931,492 | 1/1976 | Takano et al. | 219/216 |
| 3,939,325 | 1/1976 | Otani et al. | 357/28 |

Primary Examiner—Andrew J. James
Attorney, Agent, or Firm—Wenderoth, Lind & Ponack

[57] ABSTRACT

A semiconducting silicon device includes a semiconductor silicon substrate having a diffused layer and a silicon oxide film, a multi-layered electrode provided on the silicon oxide film and in contact with the diffused layer. The multi-layered electrode comprises Ti or Mo as first layer of electrode material and Ni as a second layer.

2 Claims, 12 Drawing Figures

THERMAL PRINTING HEAD

This is a continuation, of application Ser. No. 605,922, filed Aug. 19, 1975, now abandoned.

BACKGROUND OF THE INVENTION

1. Field of the Invention

The present invention relates to a semiconducting silicon device, and particularly pertains to a layer electrode therefore which avoids electrode-related deteriorations in using such silicon devices at high temperatures.

2. Description of the Prior Art

Heretofore, as a way of preventing the deterioration of multi-layer electrodes at high temperatures, various methods of protecting silicon devices have been contemplated, including packaging, etc.

Where it is impracticable because of some operational limitations to apply adequate protective measures such as packaging on silicon devices, satisfactory results can be obtained only infrequently with conventional multi-layer electrode. For example, a thermal head having a heating layer provided in part of the semiconductor silicon is available. The thermal head is in the stage of practical application in various fields, providing a recording system simplified in structure and operation.

The thermal degradation of the thermal head in equipment featuring maintenance-free operation poses a major factor govering the guarantee period of such equipment. In the thermal head having the heating layer in part of the semiconductor silicon above-mentioned, the thermal deterioration is more pronounced at the electrode part than at the heating part. That is to say, at the area where the heating part and the electrode part make contact with one another (the so-called contact part), or due to the thermal degradation of the electrode material, the recording quality is lowered.

A means to solve this problem may be found in the electrode structures for use at high temperatures which have been developed by conventional IC techniques [for instance, L. E. Terry & R. W. Wilson; Proc. IEEE, Vol 57, No. 9, P. 1580 (1969)]. These electrode structures developed by IC techniques involve very complex multi-layer structures, are highly costly, and their applications to thermal heads without modifications have not brought about satisfactory results. Thus, as electrodes for the thermal heads of this kind, aluminum(Al) which is capable of making proper Ohmic contact, and shows excellent serviceability, etc., has hitherto been most often used. However, aluminum is susceptible to corrosion, and moreover, direct soldering on aluminum is usually difficult. As an electrode in which these two disadvantages are removed, for example, Cu-Ni may be contemplated. In this instance, nickel (Ni) has a much larger coefficient of thermal expansion than that of silicon, and also has a large Young's modulus, and accordingly, if the nickel layer is made thick $(2 \sim 3\mu)$ in order to prevent the thermal diffusion of the solder layer into the silicon, the resultant large shearing stress imposed on the surface of the silicon element, as its temperature rises, will cause deterioration of the element.

An electrode material which is highly unsusceptible to environmental influences and because of the structural difficulty in perfectly packaging the electrode material would raise a problem that by the force imposed by the heat at the time of recording, the electrode part might be stripped from the semiconductor silicon and the holding part therefor on which it is adhesively placed.

BRIEF SUMMARY OF THE INVENTION

Object of the Invention

As is evident from the above description, the first object of this invention is to provide a semiconducting silicon device having multi-layer electrodes which are usable at high temperatures, and are highly unsusceptible to environmental influences.

The second object of this invention is to provide a semiconducting silicon device having multi-layer electrode materials highly unsusceptible to environmental influences and electrode structures which ensure their strong bonding with the semiconductor silicon.

Those objects of this invention may be achieved by the provision of a semiconducting silicon device having multi-layer electrodes which comprises Ti or Mo as the first layer of the electrode material and Ni as the second layer, and with multi-layer electrodes having a polycrystalline silicon layer, as part of the electrode material, provided on a silicon oxide film which is prepared on a semiconductor silicon substrate.

Other and further objects, features and advantages of the invention will appear more fully from the following detailed description:

DETAILED DESCRIPTION OF PREFERRED EMBODIMENTS

Figure 1:
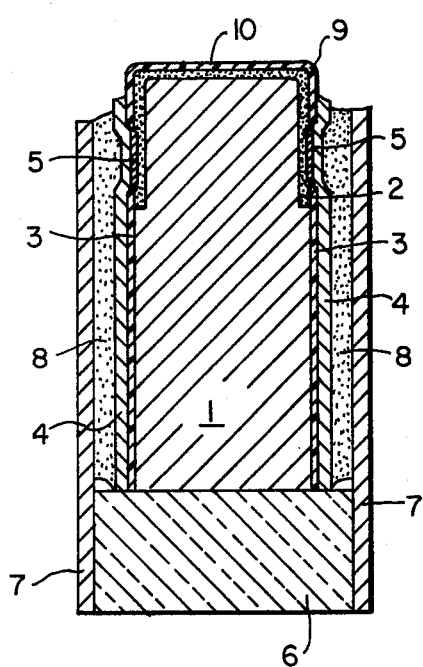
FIGS. 1 and 2 are sectional views of thermal heads for heat sensitive recording to which the electrode structures of this invention are adapted.
Figure 2:
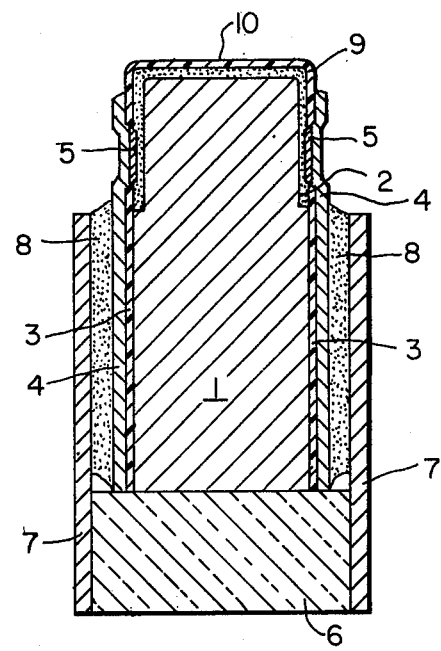

FIGS. 1 and 2 illustrate structures of thermal heads in which semiconductor silicon is employed.

Referring to these figures, 1 denotes a semiconductor silicon substrate; 2, a low resistance heating layer formed by diffusion; 3, an oxide film; 4, the electrode by which this invention is characterized; 5, the contact part; 6, the support holding the semiconductor silicon substrate 1; 7, the metal electrode plate bonded to the support 6; 8, the solder layer bonding the metal electrode plate 7 and the electrode 4; 9, a protective film; and 10, the contacting surface with the recording paper.

In the actual structures, the silicon substrate 1 is much smaller than the support 6 or the metal electrode plate 7. The choice between the structures of FIG. 1 or FIG. 2 is made on the basis of the desirable degree of projection of the semiconductor silicon as the thermal head for it to make contact with the recording paper.

According to hitherto pursued studies on the head structure, the structure of FIG. 1 is preferable in the absence of problems with the electrode.

Figure 3A:
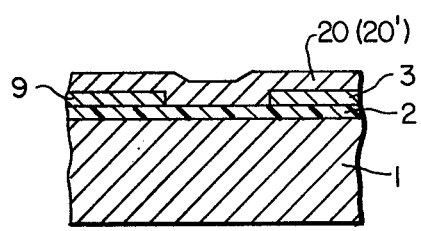
FIG. 3(A), (B) and (C) are sectional views showing the manufacturing steps of the essential part of the electrode of the aforementioned thermal heads.

In the following, the structure of the electrode part by which this invention is characterized is explained with reference to FIGS. 3A, 3B and 3C which illustrate the steps of manufacturing the electrode part by which this invention is characterized, where for the electrodes of FIGS. 1 and 2, a multi-layer structure composed of Mo-Ni-Cu is employed. 20 is a metal Mo layer; 30, a metal Ni layer; and 40, a metal Cu layer.

While it is possible to contemplate diverse methods for the manufacture of this multi-layered electrode, the three layers are consecutively formed most simply by utilizing the electron beam evaporation-deposition method. If Mo layer 20 is formed on a low specific resistance silicon (in the case of p-type, lower than 0.002Ωcm; in the case of n-type, lower than 0.001Ωcm) at a rate of vapor-deposition of higher than 1 Å/sec under a $10^{-5}$ Torr vacuum, an adequate Ohmic contact may be obtained as in the case of Al. This compares favorably with Ti, etc., with which rates of vapor-deposition higher than 50Å/sec are required for obtaining similar results. On the other hand, if the specific resistance of silicon is high, proper Ohmic contact may be obtained by the formation of, for example, Pt silicide which is well known.

Thereafter, the Ni layer 30 (FIG. 3B) and the Cu layer 40 (FIG. 3C) are consecutively formed. The formation of these two layers involves almost no technical difficulties except for their thickness control. For simplification of the process, the three layers are consecutively formed all at the same temperature, for example, 200° C. The upper limit for this common temperature is governed by the degradation (especially oxidation) of Cu, and the lower limit by the cohesive force between the Mo and SiO₂ layers. These two factors considered, the temperature at which it is possible to form the three layers consecutively may be found at 200° ~ 300° C.

The roles played by respective constituent metals in the Mo-Ni-Cu base electrode 4 are as follows:

As described hereabove, the Mo layer 20 has the effect not only of making low resistance Ohmic contact with the diffused layer of Si but also of preventing the reaction between Si and Ni-Cu at high temperatures. These effects may be confirmed by a heat-treatment test with test specimens in which, for example, the diffusion layer and the Mo-Ni-Cu base electrode are formed, for the resistance measurement of the diffusion layer. The results of this test shows that with the wafers for the thermal heads, even when subjected to a heat treatment in N₂ at 400° C and for 50hr, the variation of resistance is kept within 5%, if Mo is thicker than 5000Å. It was also confirmed, by etching the electrode of the test specimen which has been put to the above-mentioned test, that the alloying between Si and Ni-Cu is nearly completely prevented by Mo. Moreover, Mo prevents alloying between Si and Ni-Cu-solder. These facts were confirmed through comparative studies of test specimens of thermal heads which were operated by giving them inputs larger than the rated power or of test specimens in which Mo-Ni-Cu-solder or Ni-Cu-solder are formed on a quartz substrate, and which are, then, heat-treated, etc.

Another reason for providing Mo is that the strain induced in Si by Ni-Cu is relieved. Mo has nearly the same coefficient of thermal expansion as that of Si, and has a small Young's modulus. Accordingly, if the Mo layer 20 is provided, the Ni-Cu layer may be made thicker without straining the Si.

In the next place, Ni is chosen for reason of its satisfactory cohesion to Mo. Actually, almost no serving between Mo-Ni has ever been observed in the cohesion test of a series of these electrodes. 3000Å is sufficiently thick, and usually, values of 2000~5000Å are chosen.

Cu is provided for the purpose of improving the soldering property over the direct soldering on Ni. Although the strength between Ni-Cu is still larger than that between Mo-Ni, the thickness of Cu in this electrode is very important. Usually, the solder is alloyed with Cu and further with Ni when held at high temperatures. Under such a condition, improper cohesion between Ni-Cu-solder alloyed with Mo or, in extreme occasions, partial coagulation of these alloys sometimes takes place. For prevention of such a phenomenon Cu as the electrode for the thermal stylus of the heat sensitive recorder should desirably be about five microns in thickness, and accordingly, the problem stemming from strain may be solved by making the Mo about one micron thick.

As is apparent from the above descriptions, the discussion in the afore-mentioned embodiment has covered the use of solder, but the coating of Cu is spared, if the solder is not used. Furthermore, cost permitting, Cu may be replaced by such noble metals as Pt, Rh, Pd, etc.

As is evident from FIGS. 1 and 2, with regard to the heat resistance of the semiconductor devices, studies covering the Si contact part, the electrode material or, further, the material (solder in FIG. 1) for the leading-out from the electrode material, need to be undertaken.

With regard to the electrode for the thermal head, it is desirable to scrutinize the heat resistance of the structure as is shown in FIG. 1 in order to quicken the response of the head (the rate of response in terms of the temperature change of the end of the head with varying input power). The upper limit of the operating temperature of the electrode as a whole in this instance is determined by the melting point of the solder. With the electrodes of the aforementioned structure, their practical usefulness up to the upper limit temperature (305° C) was confirmed, when solder now called high temperature solder was employed. Furthermore, the thermal head with the aforementioned electrode structure of FIG. 3 which contains no solder shows a still better property; in this instance, Cu may be spared.

In the following, another electrode structure embodying this invention is described: In this embodiment, a titanium (Ti) layer 20' in place of the Mo layer of FIG. 3 is employed. Thus, on the silicon oxide film 3 in which a window is opened over the diffusion layer 2 on the silicon substrate 1, a layer 20 of titanium (Ti) is formed with a thickness of about 2 ‖ by way of vapor-deposition or spattering (FIG. 3A). Titanium makes as proper Ohmic contact as aluminum with low resistance silicon (in the case of the p-type, lower than 0.002Ωcm; in the case of n-type, lower than 0.001Ωcm), and is highly resistant to corrosion. Accordingly, titanium is useful as a primary course metal with high corrosion resistance which may take the place of aluminum. Because the difference of its coefficient of thermal expansion from that of silicon and its Young's modulus are relatively small, titanium is capable also of serving as a layer for absorbing shearing stress. Furthermore, the stopper action against alloying invoving solder may be expected of titanium. Such features of titanium may be achieved by forming the titanium layer 20' relatively thick.

Figure 3B:
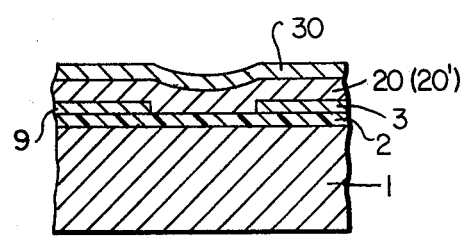
Figure 3C:
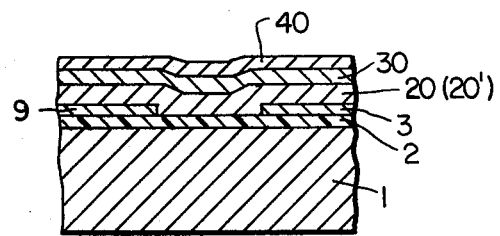

Then, as the solderable metal formed as a layer on the titanium layer, a nickel (Ni) layer 30 is formed in the desired pattern by way of vapor-deposition or spattering (FIG. 3B). This nickel layer 30 is useful from the viewpoint of oxidation and economy. Because of the large coefficient of thermal expansion and large Young's modulus of nickel, there is a tendency that large shearing stress is imposed on the surface of the silicon element, causing deterioration of the element, but this problem may be solved by forming the layer 20' of titanium relatively thick. For example, it was found that by making the layer 20' of titanium 2 thick, the shearing stress imposed on the surface of the silicon element was reduced to less than 1/3 as compared with the structure having no titanium layer formed.

Ti-Ni formed in this way was found to maintain the resistance within several % even after being subjected to a heat treatment at 400° C for 50 hr, and the excellent heat resistance of the element was revealed.

Furthermore, in order to achieve a still better soldering property than that of nickel, it is also possible to provide a copper layer 40 on the Ni layer 30, as shown in FIG. 3 (C), by way of vapor-deposition or spattering. The multi-layer electrode of this structure was actually proven to have excellent heat and corrosion resistances, just as the previously mentioned multi-layer electrode, and it has also economic advantages for mass-production.

Figure 4:
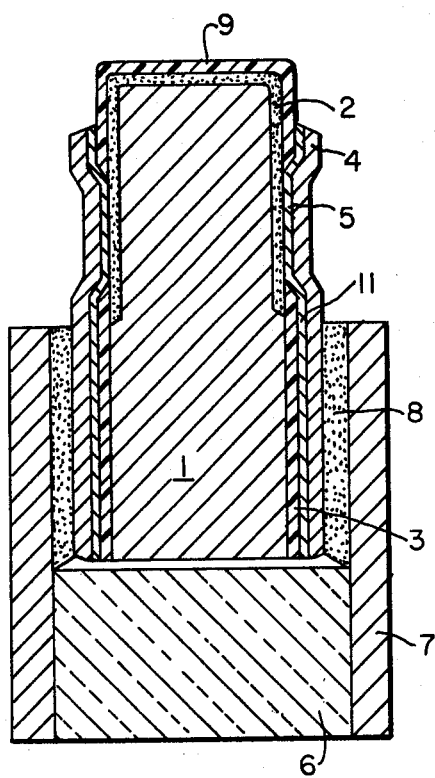
FIGS. 4, 5 and 6 are sectional views of thermal heads for heat sensitive recording to which structures of a series of electrodes based on other embodiments of this invention are adapted.

FIG. 4 illustrate still another embodiment, in which for the purpose of increasing the adhesion between the aforementioned SiO$_2$ layer and the aforementioned Ti or Mo electrode, a thin film polycrystalline silicon layer 11 about 1000Å thick is provided as part of the electrode. The limit of the thickness of the silicon layer 11 is determined by the value of the specific resistance of this layer. Thus, its thickness may be further increased.

Figure 5:
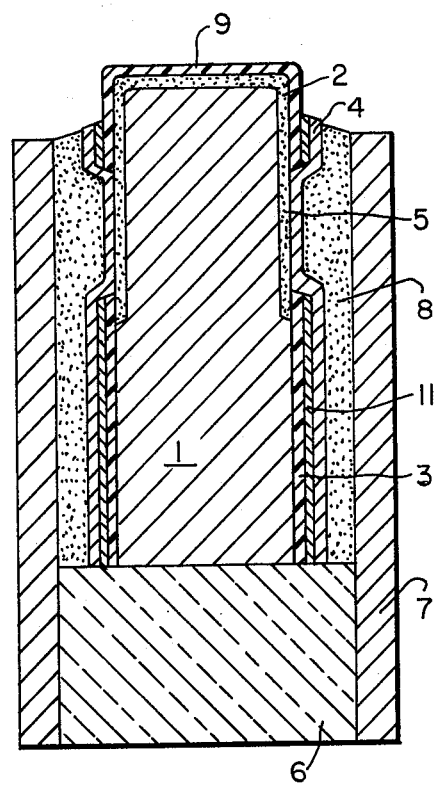
Figure 6:
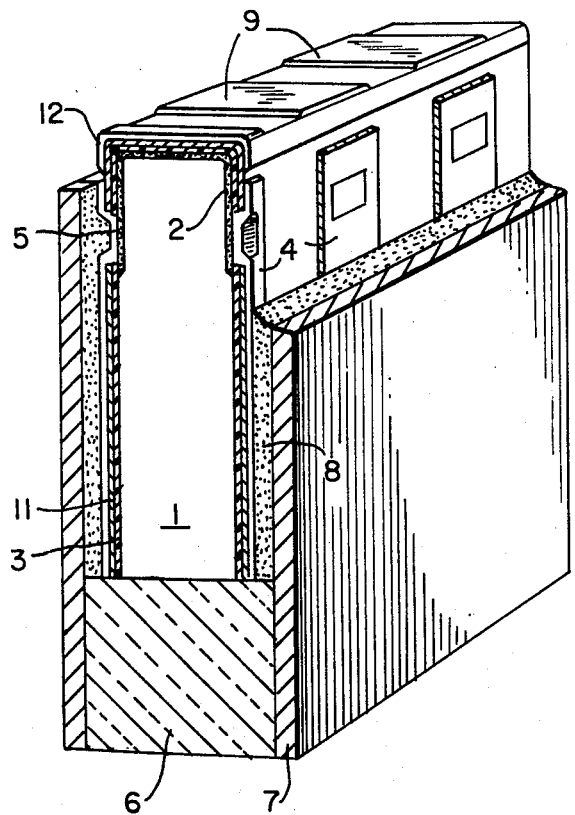

Furthermore, as shown in FIG. 5 and 6, it is also possible to provide the thin layer of silicon all along the electrode except on the contact part between the silicon and the metal electrode part. In this instance, the specific resistance of the thin layer of silicon need not necessarily to be low.

Whether or not it is advisable to provide the thin layer of silicon on the contact is determined by the length of the metal electrode from the contact part to the solder layer. Thus, it is proper to provide the silicon layer on the contact, if the resistance needs to be decreased even a little, or from the standpoint of the simplification of the manufacturing process. Either in the case of FIG. 1 or of FIG. 2, for the metal electrode 4, materials which are highly heat resistant may be selected, if the thin layer of silicon 11 is provided.

As is apparent from the above description, according to this invention, the only thing necessary is to take account of the adhesion between the silicon and the metal electrode in selecting the metal electrode. While a particularly satisfactory result is obtained by employing titanium as the second layer of the metal electrode, appreciably favorable results are obtained also with molybdenum or chromium. With regard to the requirements for forming these metal electrodes, etc., the study of their adhesive strengths on silicon oxide is unnecessary.

Furthermore, when a wear resistant layer 12 is provided, as shown in FIG. 6, to improve the resistance of the thermal lead to the wear resulting from its contact with the heat sensitive paper (not shown in the figure), the thin layer of silicon 11 serves to enhance the adhesion of the wear resistant layer 12.

If silicon carbide, titanium carbide, etc., are used for this wear resistant layer, since these layers have larger adhesive strengths on silicon than on the layer of the oxide of silicon, the effect of preventing the otherwise probable stripping of the wear resistant layer at the recording time is achieved.

Moreover, in this instance, if a silicon layer with a high specific resistance is used, the hole for providing the contact may be opened simultaneously in the silicon layer and the oxide layer in the integrated head having a plural number of heating parts, followed further by the separation etching of the metal electrode only, thereby achieving much simplication in the manufacturing process.

Figure 7:
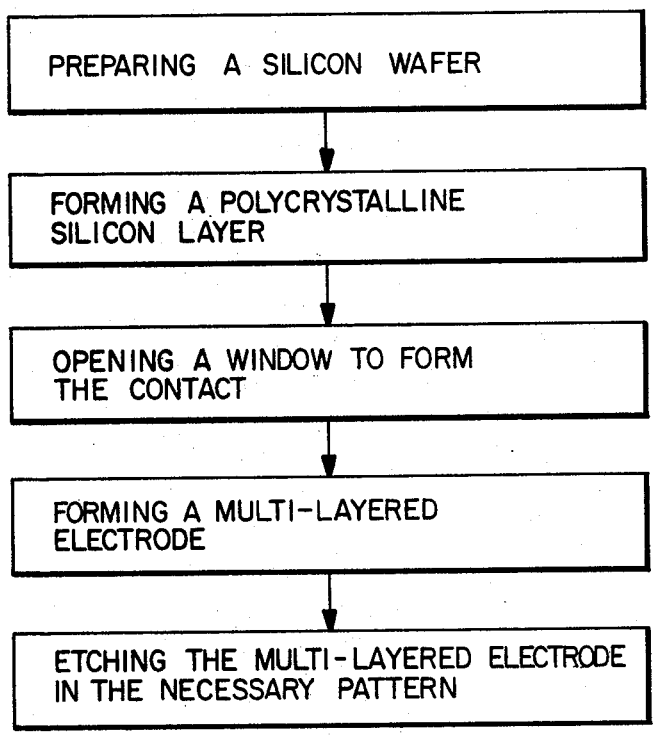
FIG. 7 is an explanatory flow chart illustrating the manufacturing method of a series of electrodes of the embodiments of FIGS. 4-6.

FIG. 7 displays the manufacturing steps of the electrode structure where the polycrystalline Si layer 11 of the embodiment of FIG. 6 is utilized.

Referring to this chart, wafer means a wafer which has been subjected to the necessary diffusion treatment, but in which the window for forming the contact is not opened. All over the surface of this wafer, the polycrystalline Si layer is formed to a thickness of about 2000Å by are ordinary gas phase reaction or by electron beam vapor-deposition. The polycrystalline Si formed in this way makes highly coherent contact with the SiO$_2$ of the wafer. In this instance, whether or not any impurity is added to the polycrystalline Si will be determined by the structure of the whole electrode.

In the following step, after forming the polycrystalline Si layer all over the surface of the wafer, the window required for forming the contact is opened. The mask used for opening this window permits consecutive etching of Si and SiO$_2$. As the etching solution for this purpose, the ordinarily often employed etching solutions, such as fluoric-nitric acid base for Si and ammonium-fluoric acid base for SiO$_2$, are usable.

On the wafer in which the window has been opened, the three layers of Ti-Ni-Cu or Mo-Ni-Cu, etc., are formed by the method of electron beam vapor deposition. In this instance, since Ti or Mo of the first layer makes direct contact with the polycrystalline Si or the diffused layer of Si, the problem of adhesion may be entirely set aside. For example, the two electrode structures above mentioned both will withstand the tension of 500 g/mm$^2$, and, if further stretched, may cause cracking in the Si substrate. Such high adhesion is achieved in these structures.

Then, the three layers are consecutively etched in the necessary electrode pattern through a mask. In this instance, the Mo-Ni-Cu structure may be etched at the same time with nitric acid or aqua regia. Because the side etching will run deeper with increasing total thickness, however, some ingenuous means must be added to such etching techniques. As such a measure, for the Ti-Ni-Cu structure, an etching solution of fluoric acid diluted with water is used, whereby more delicate patterns are reproduced. As implied above, which of Ti or Mo is used as the first layer is determined by what metal is used as the third layer 40.

It is possible to etch the polycrystalline Si layer, but it need not be etched, if this Si layer has a high specific resistance. Such etching methods are summarily illustrated by FIGS. 8 (A), (B) and (C).

Figure 8A:
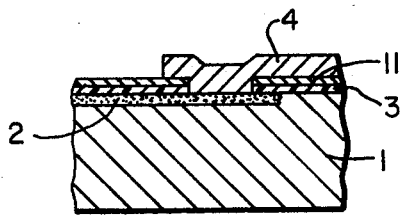
FIG. 8 (A), (B) and (C) are sectional views showing the structures obtained by the manufacturing steps of FIG. 7.
Figure 8B:
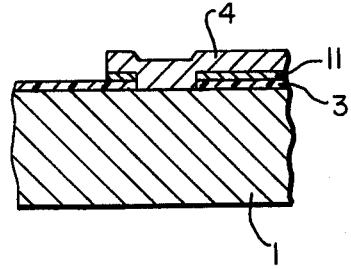
Figure 8C:
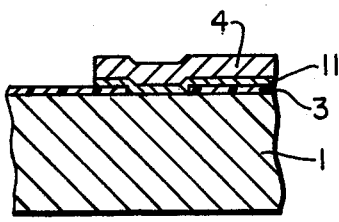

The polycrystalline layers 11 of FIGS. 8A and B have high specific resistances, whereas the layer of FIG. 8C has low specific resistance.

Whether the polycrystalline Si layer is etched as in FIGS. 8 (A) and (B) or not as in FIG. 8 (C), should be determined by the influence of the polycrystalline Si layer on the semiconducting device. Furthermore, if required, only the necessary part of the polycrystalline Si layer is etched beforehand before opening the contact window.

As described in the foregoing, the electrode structures of the semiconducting devices of this invention are by far superior to the electrode structures based on Al, with respect to the resistances thereof to temperature and environmental influences. They feature not only the simplified structures and ease of manufacture, as compared with other multi-layer electrode structures hitherto proposed for improving these properties, but they also permit firm bonding on the semiconductor silicon electrode materials excell in the resistance to environmental influences, thereby assuring stable, excellent quality. They are, thus, of high industrial value.

What we claim is:

1. A thermal printing head comprising:
   a semiconductor silicon substrate;
   a low resistance heating layer formed by diffusion on a portion of the surface of said substrate;
   a silicon oxide film formed on the surface of said substrate, including said portion having said heating layer formed thereon;
   a polycrystalline silicon layer covering said silicon oxide film;
   a wear resistant layer formed of silicon carbide provided on a first portion of said silicon layer having therebeneath a first portion of said heating layer; and
   a multilayered electrode provided on a second portion of said silicon layer, said electrode having a contact part extending through said silicon layer and said silicon oxide film into contact with a second portion of said heating layer, said electrode comprising a first layer formed of Mo or Ti in contact with said silicon layer, a second layer formed of Ni in contact with said first layer, and a third layer in contact with said second layer and formed of a material selected from the group consisting of Cu, Pt, Pd and Rh.

2. A thermal printing head as claimed in claim 1, further comprising a metal electrode plate attached to said third layer and said electrode by means of a solder layer.

* * * * *